(12) United States Patent
Lee et al.

(10) Patent No.: US 8,183,623 B2
(45) Date of Patent: May 22, 2012

(54) DUAL CHARGE STORAGE NODE MEMORY DEVICE AND METHODS FOR FABRICATING SUCH DEVICE

(75) Inventors: Chungho Lee, Sunnyvale, CA (US);
Hiroyuki Kinoshita, San Jose, CA (US);
Kuo-Tung Chang, Saratoga, CA (US);
Amol Joshi, Sunnyvale, CA (US);
Kyunghoon Min, Palo Alto, CA (US);
Chi Chang, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/075,047

(22) Filed: Mar. 29, 2011

(65) Prior Publication Data
US 2011/0175158 A1 Jul. 21, 2011

Related U.S. Application Data

(62) Division of application No. 11/408,866, filed on Apr. 20, 2006, now Pat. No. 7,915,123.

(51) Int. Cl.
*H01L 29/792* (2006.01)
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl. ............... 257/324; 257/365; 257/E21.18

(58) Field of Classification Search .................. 257/324, 257/365, E21.18
See application file for complete search history.

(56) References Cited

U.S. PATENT DOCUMENTS

| | | | |
|---|---|---|---|
| 5,548,146 A | 8/1996 | Kuroda et al. | |
| 6,215,702 B1 | 4/2001 | Derhacobian et al. | |
| 6,639,271 B1 | 10/2003 | Zheng et al. | |
| 6,861,307 B2 | 3/2005 | Zheng et al. | |
| 6,887,747 B2 | 5/2005 | Yagishita et al. | |
| 6,917,068 B1 | 7/2005 | Krivokapic | |
| 2003/0160280 A1 | 8/2003 | Yoshino | |
| 2006/0046390 A1 | 3/2006 | Shih et al. | |
| 2006/0079051 A1 | 4/2006 | Chindalore et al. | |

OTHER PUBLICATIONS

C. Retes-Betanzo et al. "Plasma Etching of Silicon Nitride with High Selectivity over Silicon Oxide and Silicon in Fluorine Containg Plasmas", Vac. Sci. Technol. A 17 (6), 3179 (1999).

*Primary Examiner* — David S Blum

(57) ABSTRACT

A dual node memory device and methods for fabricating the device are provided. In one embodiment the method comprises forming a layered structure with an insulator layer, a charge storage layer, a buffer layer, and a sacrificial layer on a semiconductor substrate. The layers are patterned to form two spaced apart stacks and an exposed substrate portion between the stacks. A gate insulator and a gate electrode are formed on the exposed substrate, and the sacrificial layer and buffer layer are removed. An additional insulator layer is deposited overlying the charge storage layer to form insulator-storage layer-insulator memory storage areas on each side of the gate electrode. Sidewall spacers are formed at the sidewalls of the gate electrode overlying the storage areas. Bit lines are formed in the substrate spaced apart from the gate electrode, and a word line is formed that contacts the gate electrode and the sidewall spacers.

11 Claims, 5 Drawing Sheets

DUAL CHARGE STORAGE NODE MEMORY DEVICE AND METHODS FOR FABRICATING SUCH DEVICE

CROSS-REFERENCE TO RELATED APPLICATIONS

This application is a divisional of U.S. patent application Ser. No. 11/408,866, now U.S. Pat. No. 7,915,123, filed on Apr. 20, 2006, entitled "Dual Charge Storage Node Memory Device and Methods for Fabricating Such," which is hereby incorporated herein by reference in its entirety.

TECHNICAL FIELD

The present invention generally relates to memory devices and to methods for fabricating memory devices, and more particularly relates to split charge storage node memory devices and to methods for fabricating such devices.

BACKGROUND

One form of semiconductor memory is a nonvolatile memory in which the memory state of a memory cell is determined by whether or not an electrical charge is stored on a charge storage layer built into the gate structure of a field effect transistor. To enhance the storage capacity of such a nonvolatile memory, two storage nodes can be built into each memory cell. The storage nodes are associated with locations in the charge storage layer at opposite sides of the gate structure. As the capacity of semiconductor memories increases, the size of each individual device that is used to implement the memory shrinks in size. With a memory that uses dual storage nodes per memory cell, the reduction in device size means that the spacing between the two storage nodes of a memory cell decreases. As the spacing between storage nodes decreases, problems arise with respect to the reliability and retention of the memory data. Charge stored in one memory node can leak through the charge storage layer to the other memory node of the memory bit to corrupt the memory stored at that other memory node. Additionally, as device size decreases, programming of one memory node can disturb the data stored in the other memory node due to relatively wide charge distributions in the charge storage layer. Such problems limit the possible choices for erasing such dual bit memory cells.

Accordingly, it is desirable to provide a semiconductor memory device and methods for fabricating semiconductor memory devices that have enhanced isolation between memory storage nodes of a dual bit memory cell. In addition, it is desirable to provide methods for fabricating semiconductor memory devices in which a gate insulator separating two memory storage nodes can be formed independently of the insulators of the charge storage node. Additionally, it is desirable to provide methods for fabricating dual bit memory devices that can be erased by Fowler-Nordheim (FN) tunneling for less power consumption. Furthermore, other desirable features and characteristics of the present invention will become apparent from the subsequent detailed description and the appended claims, taken in conjunction with the accompanying drawings and the foregoing technical field and background.

BRIEF SUMMARY

Dual memory storage node devices and methods for fabricating a dual node memory devices are provided. In accordance with one embodiment, the method comprises forming a layered structure with an insulator layer, a charge storage layer, a buffer layer, and a sacrificial layer on a semiconductor substrate. The layers are patterned to form two spaced apart stacks and an exposed substrate portion between the two stacks. A gate insulator and a gate electrode are formed on the exposed substrate, and the sacrificial layer and buffer layer are removed. An additional insulator layer is deposited overlying the charge storage layer to form insulator-storage layer-insulator memory storage areas on each side of the gate electrode. Sidewall spacers are formed at the sidewalls of the gate electrode overlying the storage areas. Bit lines are formed in the substrate spaced apart from the gate electrode, and a word line is formed that contacts the gate electrode and the sidewall spacers.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
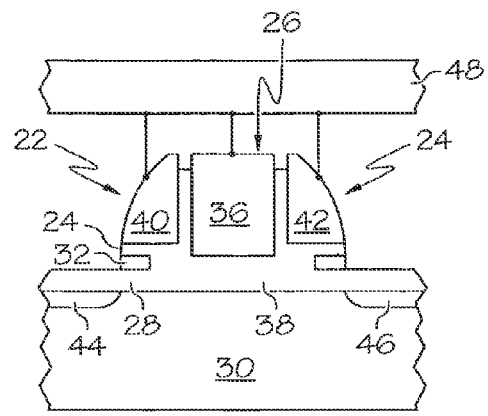
FIG. 1 illustrates schematically, in cross section, a dual storage bit semiconductor memory cell in accordance with an embodiment of the invention.

FIG. 1 illustrates schematically, in cross section, a dual storage bit semiconductor memory cell 20 in accordance with an embodiment of the invention. Memory cell 20 includes two memory storage nodes 22 and 24 that are spaced apart on opposite sides of a center gate 26. Each of the memory storage nodes can include a thin insulator layer 28 formed at the surface of a semiconductor substrate 30. A layer of charge storage material 32 overlies thin insulator layer 28, and a second layer of insulator 34 overlies the layer of charge storage material. A central gate electrode 36 overlies a relatively thicker gate insulator 38 that separates memory storage nodes 22 and 24 and the layer of charge storage material that makes up a portion of the charge storage nodes. Conductive sidewall spacers 40 and 42 overlie memory storage nodes 22 and 24, respectively. Bit lines 44 and 46 are formed in the semiconductor substrate in self alignment with central gate electrode 36 and sidewall spacers 40 and 42 and define the boundaries of a channel of the memory cell. A word line 48 is coupled to the central gate electrode and to the conductive sidewall spacers.

In accordance with various embodiments of the invention, gate insulator 38 is formed independently of thin insulator layer 28 and thus can be an arbitrary thickness which is advantageous for Fowler-Nordheim (FN) erasing of the memory cell as well as for hot hole injection. The FN erasing requires sufficiently thick gate insulator to sustain the high erase field. The relatively thick gate insulator also reduces the problem of lateral charge diffusion from node to node within a memory cell as does the discontinuous nature of the layer of charge storage material. Other advantages of the inventive methods will become apparent from the description of the various embodiments below.

FIGS. 2-13 illustrate schematically, in cross section, method steps for the fabrication of a memory device in accordance with the various embodiments of the invention. Many of the steps employed in the fabrication of semiconductor devices are well known and so, in the interest of brevity, some of those conventional steps will only be mentioned briefly herein or will be omitted entirely without providing the well known process details.

Figure 2:
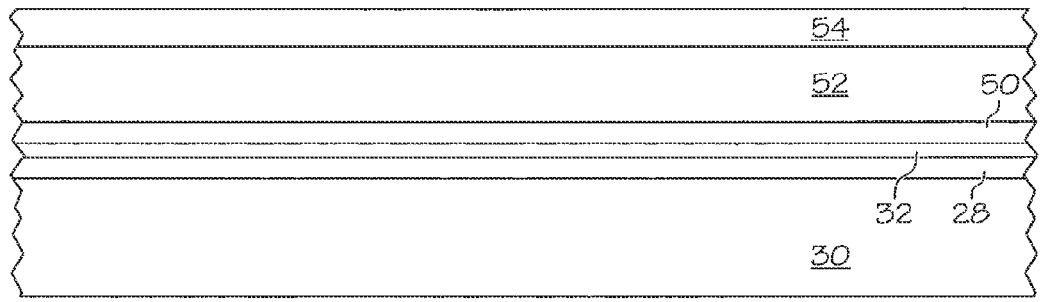
FIGS. 2-13 illustrate schematically, in cross section, method steps for fabricating a semiconductor memory device in accordance with an embodiment of the invention.

The method begins, as illustrated in FIG. 2, with a semiconductor substrate 30, preferably a silicon substrate, upon which is formed a thin insulating layer 28. A layer of charge storage material 32 is deposited on the thin insulating layer and a buffer layer 50 is deposited on the layer of charge storage material. After depositing buffer layer 50, a sacrificial layer 52 and a hard mask layer 54 are sequentially deposited.

As used herein, the term "silicon substrate" will be used to encompass the relatively pure or lightly impurity doped monocrystalline silicon materials typically used in the semiconductor industry as well as silicon admixed with other elements such as germanium, carbon, and the like to form substantially monocrystalline semiconductor material. Preferably thin insulating layer 28 is a layer of silicon dioxide having a thickness of about 3-10 nanometers (nm). Layer 28 can be a thermally grown layer of silicon dioxide or can be deposited, for example, by low pressure chemical vapor deposition (LPCVD). Thin insulator layer 28 is often referred to as a tunnel oxide layer, a layer through which programming or erasing charge carriers can tunnel. Layer of charge storage material 32 can be, for example, a layer of silicon nitride, silicon rich silicon nitride, polycrystalline silicon, or any of the other well known charge trap materials. Stoichiometric silicon nitride is $Si_xN_y$ for which x=3 and n=4; silicon rich silicon nitride is a silicon/nitrogen material for which x/y is greater than ¾. Silicon rich nitride is more conductive than stoichiometric silicon nitride, which may contribute to the problem of lateral charge diffusion between memory storage nodes in a conventional dual bit memory cell, but silicon rich silicon nitride tends to have shallower trap energy levels and higher trap density, both of which allow electrons to move easily to enable Fowler-Nordheim erase. The layer of charge storage material can be deposited, for example, to a thickness of about 7 nm by chemical vapor deposition (CVD), plasma enhanced chemical vapor deposition (PECVD), or by LPCVD. Buffer layer 50 can be, for example, a layer of silicon oxide having a thickness of about 5-20 nm deposited by LPCVD. Buffer layer 50 serves as an etch stop layer between layer of charge storage material 32 and the overlying sacrificial layer 52. Sacrificial layer 52 is preferably a layer of silicon nitride or silicon rich silicon nitride having a thickness of about 50-200 nm and deposited by LPCVD. Hard mask layer 54 can be, for example, a layer of silicon oxide or silicon oxynitride having a thickness of about 50-200 nm. Hard mask layer 54 should have different etch characteristics than does sacrificial layer 52. The deposited silicon oxide layers can be deposited, for example, from either a tetraethylorthosilicate (TEOS) or $SiH_4$ (silane) source, the silicon nitride or silicon rich silicon nitride can be deposited, for example, from the reaction of dichlorosilane and ammonia, and polycrystalline silicon can be deposited, for example, from the reduction of silane.

Figure 3:
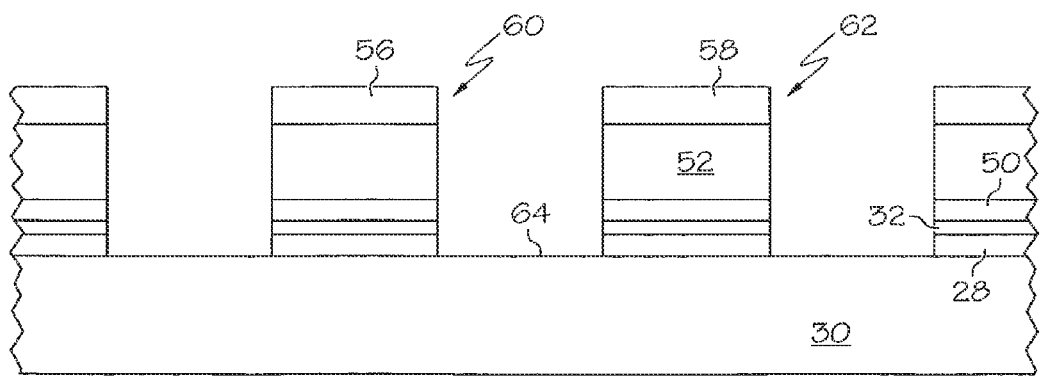

As illustrated in FIG. 3, hard mask layer 54 is photolithographically patterned and etched to form two hard mask regions 56 and 58. The two hard mask regions are used as an etch mask to etch sacrificial layer 52, buffer layer 50, charge storage layer 34 and thin insulator layer 28. The hard mask, sacrificial layer, buffer layer and charge storage layer are preferably etched by plasma etching and the thin insulator layer is preferably etched in a dilute hydrofluoric acid solution. Etching the layers results in the formation of two spaced apart stacks 60 and 62 with an exposed portion 64 of semiconductor substrate 30 between the stacks. Preferably the stacks are spaced apart by a minimum etch dimension of, for example, about 20-100 nm. The spaced apart stacks will be used to define spaced apart gate electrode boundaries. Although only two spaced apart stacks have been identified and labeled with a number, those of skill in the art will appreciate that the memory device may include a plurality of such stacks including, for example, those illustrated at the edges of the figure.

Figure 4:
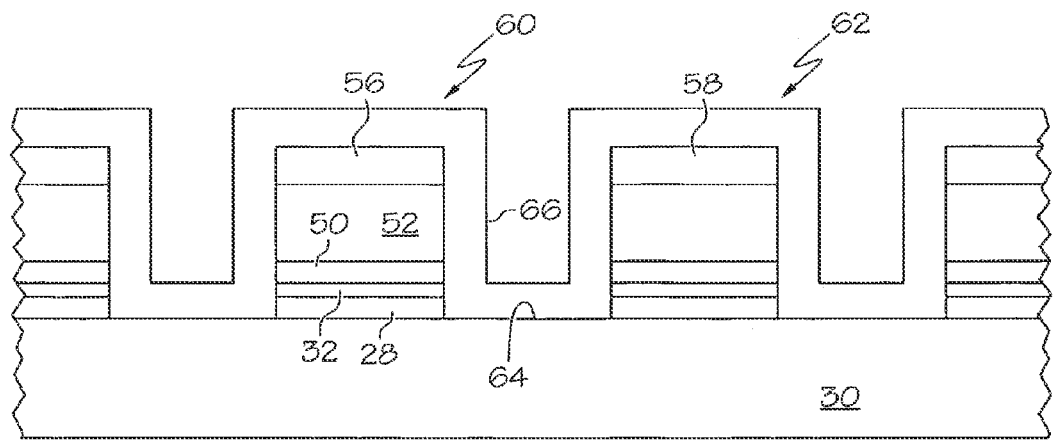

Following the etching of thin insulator layer 28, a gate insulator layer 66 is deposited on exposed portion 64 of the semiconductor substrate and on the top and side walls of the spaced apart stacks as illustrated in FIG. 4. Gate insulator layer 66 is preferably a layer of silicon dioxide deposited by LPCVD or PECVD from a TEOS source or grown by thermal oxidation or a combination of thermal oxidation and deposition to a thickness of about 10-30 nm. Following deposition, the gate insulator layer is densified by heating to a temperature of about 800-1100° C. As deposited and annealed, the gate insulator will have a specified dielectric constant and a specified thickness. The effective dielectric thickness for the gate insulator is given by the physical thickness divided by the dielectric constant.

Figure 5:
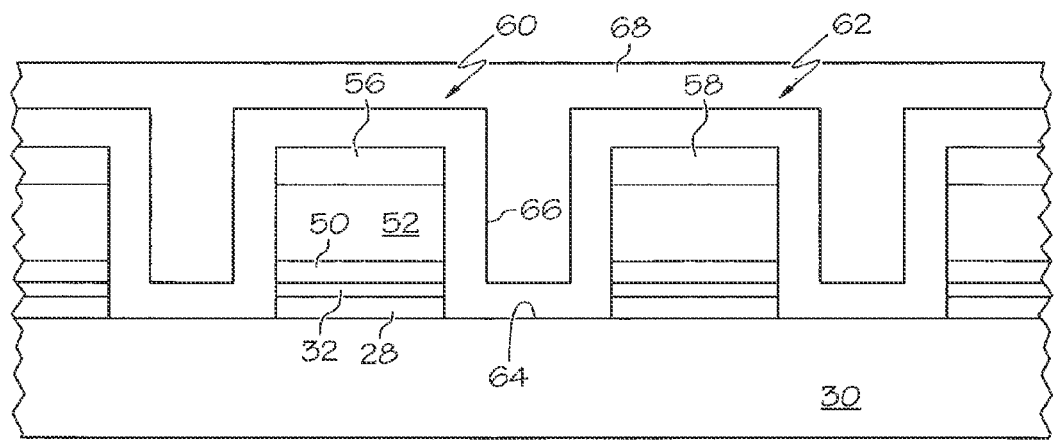

As illustrated in FIG. 5, a layer of gate electrode forming material 68 is blanket deposited onto the gate insulator layer and overlying the spaced apart stacks. Preferably the gate electrode forming material is polycrystalline silicon deposited to a thickness of about 100-200 nm to fill the opening between the spaced apart stacks. The gate electrode forming material will hereinafter be referred to, for ease of reference but without limitation, as polycrystalline silicon. Polycrystalline silicon can be deposited as either an impurity doped or undoped layer by the reduction of silane in an LPCVD reaction.

Figure 6:
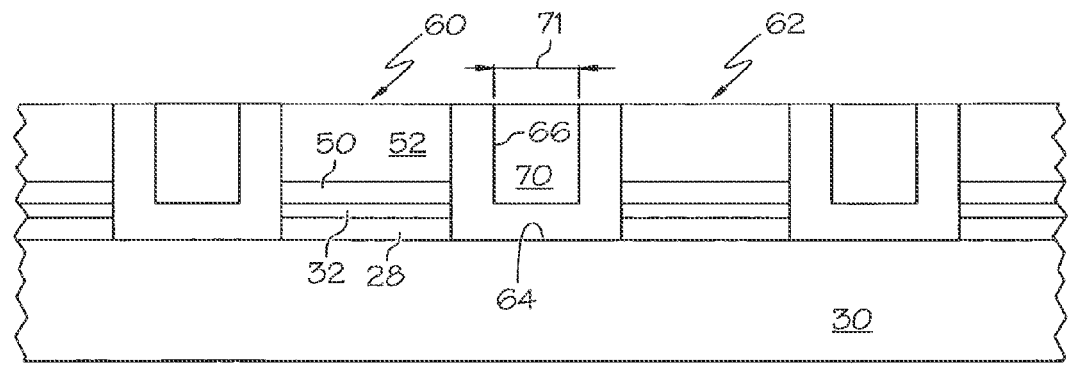

In accordance with one embodiment of the invention the surface of the structure illustrated in FIG. 5 is planarized, thr example by chemical mechanical polishing (CMP), to remove the polycrystalline silicon, gate insulator layer, and layer of hard mask material overlying the spaced apart stacks. Planarizing the structure exposes the top of the sacrificial layer and defines a gate electrode 70 between the spaced apart stacks as illustrated in FIG. 6. The length of gate electrode 70 is indicated by double headed arrow 71.

Figure 7:
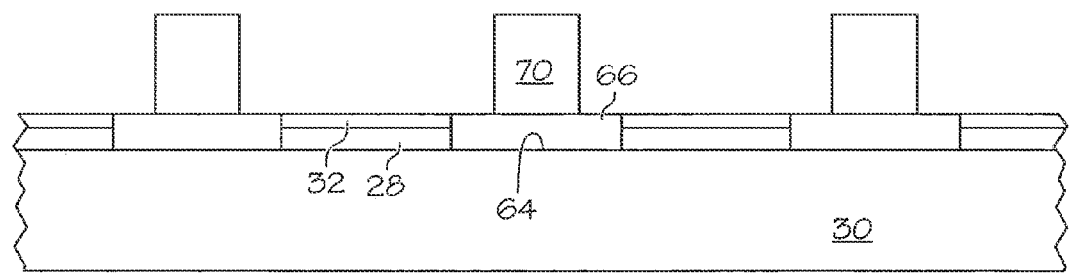

The method for fabricating a semiconductor memory device continues, in accordance with an embodiment of the invention, by etching patterned sacrificial layer 52, the sidewall portion of gate insulator layer 66 originally deposited along the sidewalls of the patterned sacrificial layer, and buffer layer 50 as illustrated in FIG. 7. The buffer layer acts as an etch stop and allows the removal of sacrificial layer 52 without damaging charge storage layer 32. Sacrificial layer 52 can be etched, for example, by plasma etching in a chlorine chemistry that stops on buffer layer 50. The etch method can then be changed to etch the buffer layer and the gate insulator layer by wet etching in a dilute hydrofluoric acid solution.

Figure 8:
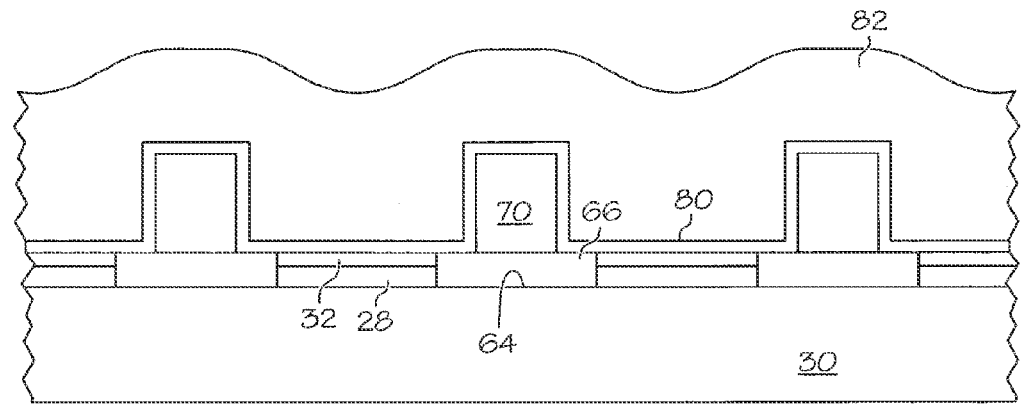

As illustrated in FIG. 8, a layer of top insulator 80 is deposited on polycrystalline gate electrode 70 and on the now exposed charge storage layer 32. Top insulator 80 is preferably a layer of silicon oxide that can be deposited to a thickness of for example, 3-20 nm by LPCVD or PECVD. The silicon oxide can be deposited from a TEOS source and is densified after deposition by heating to a temperature of about 800-1100° C. Top insulator 80, charge storage layer 32 and bottom insulator layer 28 form insulator-charge storage layer-insulator stack structures on either side of gate electrode 70 and gate insulator 66. The insulator-charge storage layer-insulator stack is formed independently of gate insulator 66. Each of the layers of the stack is characterized by a dielectric constant and by a physical thickness. Preferably the effective dielectric thickness, taken as the sum of the effective dielectric thickness of each of the individual layers, is less than the effective dielectric thickness of gate insulator 66. The difference in effective dielectric thickness is advantageous in FN channel erasing of the memory storage nodes. After densifying top insulator 80, a layer of spacer forming material 82 is deposited overlying the top insulator as also illustrated in FIG. 8. Preferably the layer of spacer forming material is a layer of polycrystalline silicon having a thickness of about 10-50 nm. The layer of spacer forming material will hereinafter be referred to, for ease of discussion but without limitation, as a layer of polycrystalline silicon. The polycrystalline silicon layer can be deposited as an impurity doped layer or as an undoped layer.

Figure 9:
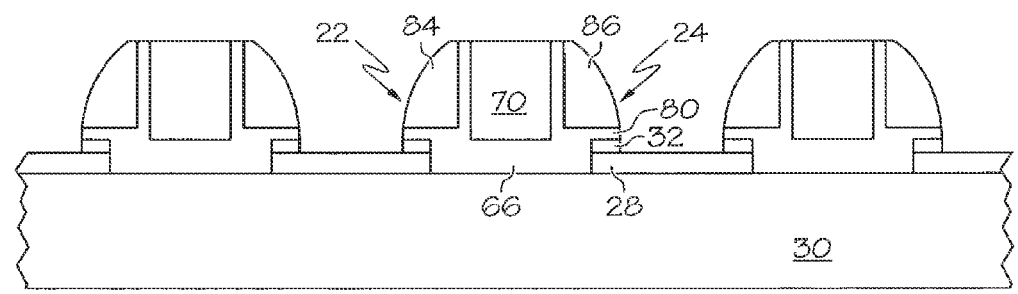

The method continues in accordance with an embodiment of the invention by the formation of sidewall spacers 84 and 86 at the sidewalls of gate electrode 70 as illustrated in FIG. 9. The sidewall spacers are formed by anisotropically etching the layer of polycrystalline silicon spacer forming material. The spacers can be etched, for example, by reactive ion etching (RIE). After forming sidewall spacers 84 and 86, the exposed portions of top insulator layer 80 and charge storage layer 32 are etched using the side wall spacers as an etch mask. The portion of the top insulator layer present on the top of gate electrode 70 is removed by either the anisotropic etching or by the subsequent etching step. Preferably the etching process is stopped leaving thin insulator layer 28 on the surface of substrate 30 between adjacent sidewall spacers. The sidewall spacers overlie the insulator-charge storage layer-insulator stack structures on either side of gate electrode 70; sidewall spacers 84 and 86, together with the stack structures form memory storage nodes 22 and 24, respectively. The formation of spacers 84 and 86 is independent of the length of gate electrode 70 (indicated by double headed arrow 71 in FIG. 6) and thus is not limited by gate length scaling.

Figure 10:
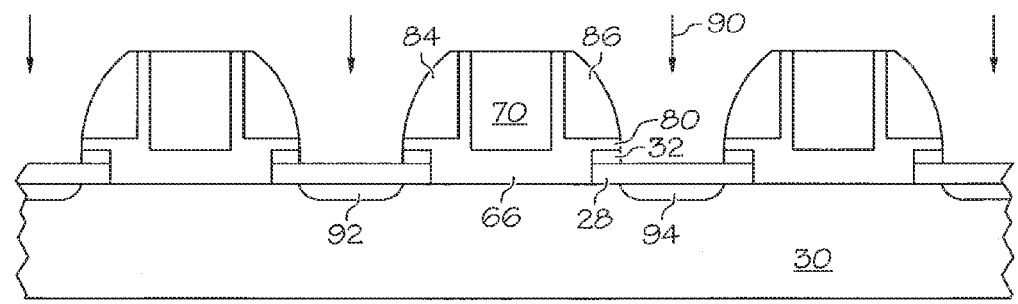

As illustrated in FIG. 10, gate electrode 70 and sidewall spacers 84 and 86 are used as an ion implantation mask and conductivity determining ions are implanted into semiconductor substrate 30 as indicated by arrows 90 to form bit lines 92 and 94 aligned to the sidewall spacers. In a preferred embodiment semiconductor substrate 30 is impurity doped P-type and N-type ions such as arsenic ions or phosphorus ions are implanted to form N-type bit lines. Because the bit lines are formed after the gate structure and memory storage nodes, thermal budget with respect to the impurity doped regions is minimized. Minimizing the thermal budget is consistent with the goal of minimizing device sizes. The implanted ions are also implanted into the gate electrode and into sidewall spacers 84 and 86. The sidewall spacers and gate electrode, if not already deposited as impurity doped material, are impurity doped by the bit line ion implantation. The sidewall spacers are thus made electrically conductive either by in situ doping during the deposition of the polycrystalline silicon or by ion implantation doping.

Figure 11:
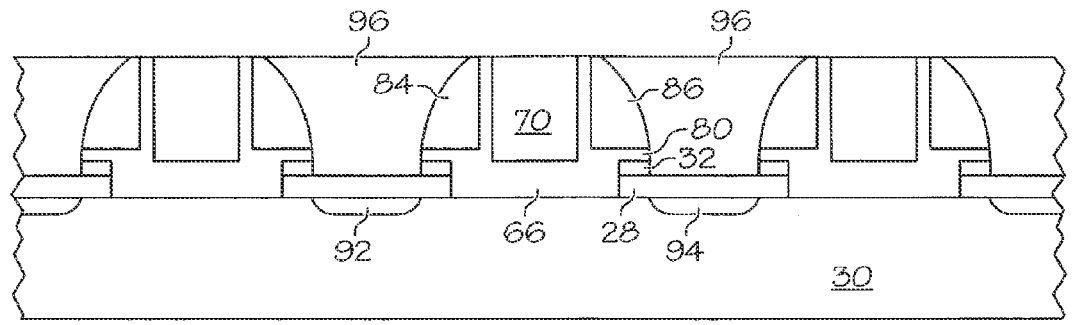
Figure 12:
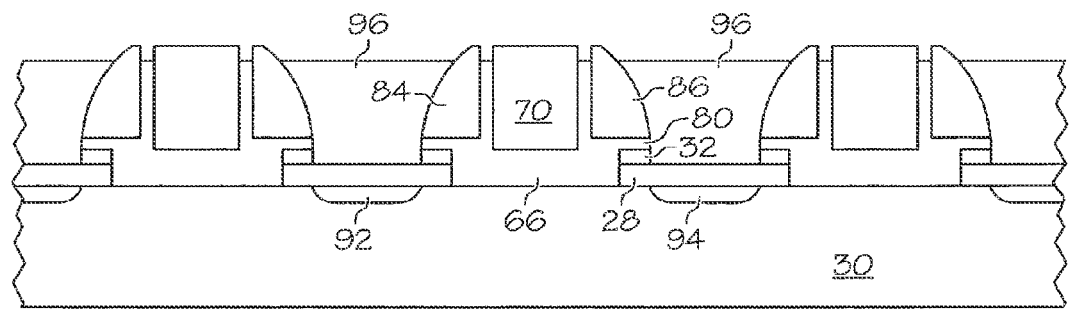

The method in accordance with an embodiment of the invention continues by the deposition of an insulating material 96 overlying the bit lines and filling the gaps between the conductive sidewall spacers. The insulating material can be, for example, a deposited silicon oxide. Following the deposition, the top surface of insulating material 96 can be planarized by CMP to expose the top portion of gate electrode 70 and sidewall spacers 84 and 86 as illustrated in FIG. 11. In a preferred embodiment of the invention the CMP process step is followed by an etch step to remove a portion of insulating material 96 and to hilly expose the tops of gate electrode 70 and sidewall spacers 84 and 86 as illustrated in FIG. 12. If the insulating material is a silicon oxide, the etch step can be accomplished by a dip in a dilute HF solution.

Figure 13:
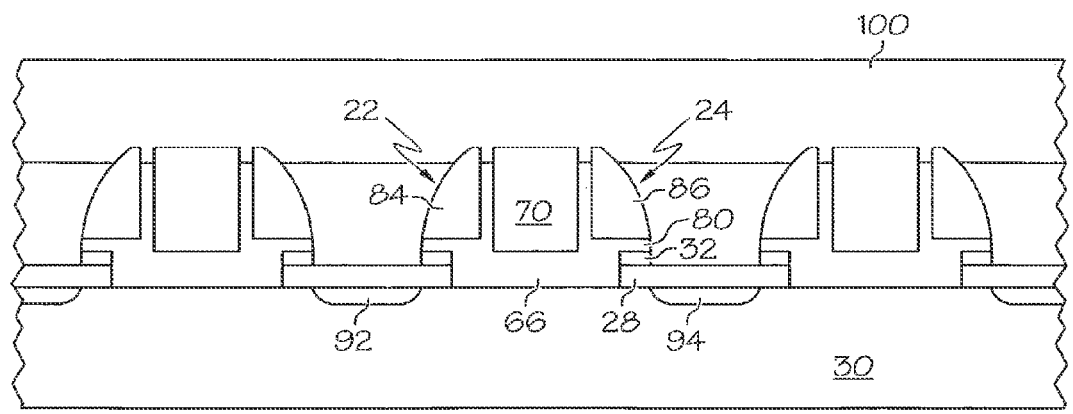

As illustrated in FIG. 13, the method in accordance with one embodiment of the invention is continued by depositing a blanket layer 100 of polycrystalline silicon or other conductive material in contact with the exposed tops of gate electrode 70 and conductive sidewall spacers 84 and 86. The blanket layer is preferably deposited as an impurity doped layer of polycrystalline silicon. Although not seen in this cross sectional view, blanket layer 100 is photolithographically patterned and etched to form a word line coupled to gate electrode 70 and to conductive sidewall spacers 84 and 86.

Those of skill in the art will appreciate that a completed memory device will include isolation such as shallow trench isolation between devices that need to be electrically isolated, electrical contacts to the bit lines and to the word lines, bit line drivers, word line drivers, clock circuits, address decoding circuits and the like. Fabrication of such structural and circuit elements can be easily integrated with the method for fabricating the memory cell structure that has been described herein to fabricate a complete semiconductor memory device.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A dual bit memory cell comprising:
   a semiconductor substrate having a surface;
   a gate insulator formed at the semiconductor substrate surface;
   a gate electrode overlying the gate insulator;
   first and second memory charge storage nodes adjacent the gate electrode, each of the first and second memory storage nodes comprising a first insulator layer, a charge storage layer overlying the first insulator layer, and a second insulator layer overlying the charge storage layer;
   first and second conductive sidewall spacers overlying the first and second memory storage nodes, respectively and spaced apart from the gate electrode by an insulating layer;
   first and second bit lines formed in the semiconductor substrate and aligned with the first and second memory storage nodes; and
   a word line coupled to the gate electrode and to the first and second conductive sidewall spacers.

2. The memory cell of claim 1 wherein said charge storage layer comprises material selected from the group consisting of silicon nitride, silicon rich silicon nitride, and polycrystalline silicon.

3. The memory cell of claim 1 wherein the gate insulator comprises a layer of silicon oxide having a first effective dielectric thickness and wherein the first insulator layer, the charge storage layer and a third insulator layer, in combination, have a second effective dielectric thickness that is less than the first effective dielectric thickness.

4. The memory cell of claim 1 wherein the gate electrode comprises polycrystalline silicon.

5. A semiconductor memory device, comprising:
a layered structure comprising a first insulator layer formed at a surface of the semiconductor substrate and a charge storage layer overlying the first insulator layer;
a gate insulator and a gate electrode formed between the spaced apart gate electrode boundaries, the gate electrode having sidewalls adjacent the spaced apart gate electrode boundaries;
a second insulator layer overlying the charge storage layer adjacent the gate electrode;
sidewall spacers overlying the sidewalls of the gate electrode and the second insulator layer and defining spaced apart first and second memory storage areas adjacent the gate electrode wherein the sidewall spacers are separated from the gate electrode by respective insulator layers;
first and second bit lines formed in the semiconductor substrate to be aligned with the sidewall spacers; and
a conductive material comprising a word line that is electrically coupled to the gate electrode and to the sidewall spacers.

6. The semiconductor memory device of claim 5 wherein the first insulating layer comprises a tunnel oxide layer and the charge storage layer comprises a material that is selected from the group consisting of silicon nitride, silicon rich nitride, and polycrystalline silicon.

7. The semiconductor memory device of claim 5 wherein the gate insulator comprises a layer of silicon oxide having a first effective dielectric thickness and wherein a dielectric layer, the charge storage layer, and the tunnel oxide layer together have a combined second effective dielectric thickness that is less than the first effective dielectric thickness.

8. A semiconductor memory device, comprising:
a gate insulator layer formed at a surface of a semiconductor substrate;
a conductive gate electrode having first and second sides overlying the gate insulator layer;
first and second memory storage areas adjacent the first and second sides of the gate electrode, each of the first and second memory storage areas comprising a first insulator layer on the surface of the semiconductor substrate, a charge storage layer overlying the first insulator layer, and a second insulator layer overlying the charge storage layer;
conductive sidewall spacers formed at the first and second sides of the gate electrode and overlying the first and second memory storage areas wherein the sidewall spacers are separated from the gate electrode by respective insulator layers;
first and second bit lines formed in the semiconductor substrate aligned with the conductive sidewall spacers; and
a conductive material patterned to form a word line electrically coupled to the gate electrode and to the conductive sidewall spacers.

9. The semiconductor memory device of claim 8 wherein the conductive gate electrode comprises polycrystalline silicon.

10. The semiconductor memory device of claim 8 comprising first and second memory storage areas comprises polycrystalline silicon.

11. The semiconductor memory device 8 wherein the step of forming conductive sidewall spacers comprises a layer of polycrystalline silicon overlying the gate electrode and the first and second memory storage areas that is anisotropically etched.

* * * * *